United States Patent
Ohtake et al.

(10) Patent No.: US 7,099,182 B2
(45) Date of Patent: Aug. 29, 2006

(54) STATIC RANDOM ACCESS MEMORY AND PSEUDO-STATIC NOISE MARGIN MEASURING METHOD

(75) Inventors: Hiroyuki Ohtake, Tokyo (JP); Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 11/022,791

(22) Filed: Dec. 28, 2004

(65) Prior Publication Data

US 2006/0098475 A1    May 11, 2006

(30) Foreign Application Priority Data

Nov. 5, 2004    (JP) ............................. 2004-322497

(51) Int. Cl.
*G11C 11/00*    (2006.01)

(52) U.S. Cl. ................ 365/154; 365/156; 257/E27.098
(58) Field of Classification Search ................ 365/154, 365/156; 257/E27.098, E27.099
See application file for complete search history.

(56) References Cited

U.S. PATENT DOCUMENTS

| | | | | | |
|---|---|---|---|---|---|
| 5,680,356 | A | * | 10/1997 | Yamauchi | .................... 365/205 |
| 5,687,178 | A | * | 11/1997 | Herr et al. | .................... 714/721 |
| 5,946,226 | A | * | 8/1999 | Chien et al. | ................. 365/156 |
| 6,738,283 | B1 | * | 5/2004 | Kasai et al. | ................. 365/154 |

OTHER PUBLICATIONS

"The Impact of Intrinsic Device Fluctuations on CMOS SRAM Cell Stability" Bhavnagarwala, A.J.; Xinghai Tang; Meindl, J.D.; Solid-State Circuits, IEEE Journal of vol. 36, Issue 4, Apr. 2001 pp.658-665.*
"Static-Noise Margin Analysis of MOS SRAM Cells" Seevinck, E.; List, F.J.; Lohstroh, J.; Solid-State Circuits, IEEE Journal of vol. 22, Issue 5, Oct. 1987 pp.748-754.*
"Noise Margin and Leakage in Ultra-Low Leakage SRAM Cell Design" Hook, T.B.; Breitwisch, M.; Brown, J.; Cottrell, P.; Hoyniak, D.; Chung Lam; Mann, R.; Electron Devices, IEEE Transactions on vol. 49, Issue 8, Aug. 2002 pp. 1499-1501.*

* cited by examiner

*Primary Examiner*—Richard Elms
*Assistant Examiner*—Eric J. Wendler
(74) *Attorney, Agent, or Firm*—Oblon, Spivak, McClelland, Maier & Neustadt, P.C.

(57) ABSTRACT

A first inverter includes a first load element and a first transistor, which are connected between first and second terminals in series, a first input terminal and a first output terminal. A second inverter includes a second load element and a second transistor, which are connected between third and fourth terminals in series, a second input terminal and a second output terminal. A first transfer transistor selectively and electrically connects the first output terminal and a first bit line. A second transfer transistor selectively and electrically connects the second output terminal and a second bit line. When data are read from the memory cell which comprises the first and second inverters and the first and second transfer transistors, a first potential is applied to the second terminal and a second potential different from the first potential is applied to the fourth terminal.

11 Claims, 6 Drawing Sheets

STATIC RANDOM ACCESS MEMORY AND PSEUDO-STATIC NOISE MARGIN MEASURING METHOD

CROSS-REFERENCE TO RELATED APPLICATIONS

This application is based upon and claims the benefit of priority from prior Japanese Patent Application No. 2004-322497, filed Nov. 5, 2004, the entire contents of which are incorporated herein by reference.

BACKGROUND OF THE INVENTION

1. Field of the Invention

The present invention relates to a static random access memory (SRAM), and for example, a static noise margin (SNM) of a memory cell.

2. Description of the Related Art

The memory cells of an SRAM typically have first and second inverters whose inputs and outputs are connected to each other, and first and second transfer transistors that connect the output ends of the first and second inverters to a bit line pair. The first and second inverters include a load transistor and a driver transistor. Gates of the first and second transfer transistors are connected to a word line WL.

Conventionally, in order to measure SNM, measurement memory cells which are provided separately from normal memory cells are used. The measurement memory cells have a pad connected to respective nodes in addition to the constitution of the memory cells. At the time of measurement, a bit line and a word line are fixed at a potential VDD. In a state that terminals of the first and second inverters are biased to a predetermined potential, a relationship (transfer curve) between nodes NB and NA corresponding to an input terminal and an output terminal of the first inverter is obtained. That is to say, a potential supply end to the second inverter is opened and a potential supply ends to the first inverter are biased to potentials VDD and VSS. In this state, the potential of the node NB changes from VSS to VDD. When the potential of the terminal NB is plotted along the abscissa and the potential of the terminal NA is plotted along the ordinate, the transfer curve of the first inverter is obtained.

Similarly, in a state that the potential supply end to the first inverter is opened and the potential supply ends to the second inverter are biased to potential VDD and potential VSS, the potential of the node NA changes from VSS to VDD, so that a transfer curve of the second inverter is obtained. The two transfer curves are overlapped. As a result, the stability characteristics of a cell (butterfly curve) can be obtained as shown in FIG. 1 in the article "The Impact of Intrinsic Device Fluctuations on CMOS SRAM Cell stability" by Azzez j. Bhavnagarwala et al., in IEEE journal Of Solid-state Circuits", April, 2001, Vol. 36, No. 4, p. 659. The length of one side of a square inscribed in two areas surrounded by the two transfer curves corresponds to SNM. In general, the larger the SNM, the harder it is for data destruction to occur because of power-source voltage noise in a chip. For this reason, it is important when designing memory cells to set SNM to a large value, and an SNM check is important for the development of cells.

The above method, however, enables only the measurement of SNM in the measurement memory cells, but cannot measure SNM in memory cells on chips as products. Further, since an actual measurement is made in a state that pins are attached to respective pads in each measurement cell, a very long measurement time is required, and the amount of data obtained is limited.

BRIEF SUMMARY OF THE INVENTION

According to a first aspect of the present invention, there is provided a static random access memory comprising a memory cell which comprises: a first inverter having a first load element and a first transistor, a first input terminal and a first output terminal, the first load element and the first transistor being connected between a first terminal and a second terminal in series, a first potential being applied to the second terminal at a time when data are read from the memory cell; a second inverter having a second load element and a second transistor, a second input terminal connected to the first output terminal and a second output terminal connected to the first input terminal, the second load element and the second transistor being connected between a third terminal and a fourth terminal in series, a second potential different from the first potential being applied to the fourth terminal at a time when data are read from the memory cell; a first transfer transistor which selectively and electrically connects the first output terminal and a first bit line; and a second transfer transistor which selectively and electrically connects the second output terminal and a second bit line.

According to a second aspect of the present invention, there is provided a pseudo-static noise margin measuring method for a memory cell which comprises: a first inverter having a first load element and a first transistor, a first input terminal and a first output terminal, the first load element and the first transistor being connected between a first terminal and a second terminal in series; a second inverter having a second load element and a second transistor, a second input terminal connected to the first output terminal and a second output terminal connected to the first input terminal, the second load element and the second transistor being connected between a third terminal and a fourth terminal in series; a first transfer transistor which selectively and electrically connects the first output terminal and a first bit line; and a second transfer transistor which selectively and electrically connects the second output terminal and a second bit line, the method comprising: in a state that a high potential is applied to the first terminal and the third terminal and a low potential lower than the high potential is applied to the second terminal and the fourth terminal, writing write data into the memory cell; after the write data are written into the memory cell, in a state that the high potential−ΔV is applied to the first terminal and the third terminal, the low potential is applied to the fourth terminal and the low potential+ΔV is applied to the second terminal, reading read data from the memory cell; and verifying matching of the write data with the read data.

According to a third aspect of the present invention, there is provided a pseudo-static noise margin measuring method for a memory cell which comprises: a first inverter having a first load element and a first transistor, a first input terminal and a first output terminal, the first load element and the first transistor being connected between a first terminal and a second terminal in series; a second inverter having a second load element and a second transistor, a second input terminal connected to the first output terminal and a second output terminal connected to the first input terminal, the second load element and the second transistor being connected between a third terminal and a fourth terminal in series; a first transfer transistor which selectively and electrically connects the first output terminal and a first bit line; and a second transfer transistor which selectively and electrically connects the second output terminal and a second bit line, the method comprising: in a state that a high potential is applied to the first terminal and the third terminal and a low potential lower than the high potential is applied to the second terminal and the fourth terminal, writing write data into the memory cell; after the write data are written into the memory cell, in a state that the high potential is applied to the first terminal, the high potential-ΔV is applied to the third terminal, the low potential is applied to the fourth terminal and the low potential+ΔV is applied to the second terminal, reading read data from the memory cell; and verifying matching of the write data with the read data.

DETAILED DESCRIPTION OF THE INVENTION

Embodiments of the present invention are explained below with reference to the drawings. In the following explanation, like parts having the approximately same functions and constitutions are designated by like reference numerals, and overlapped explanation is given only when necessary.

(First Embodiment)

Figure 1:
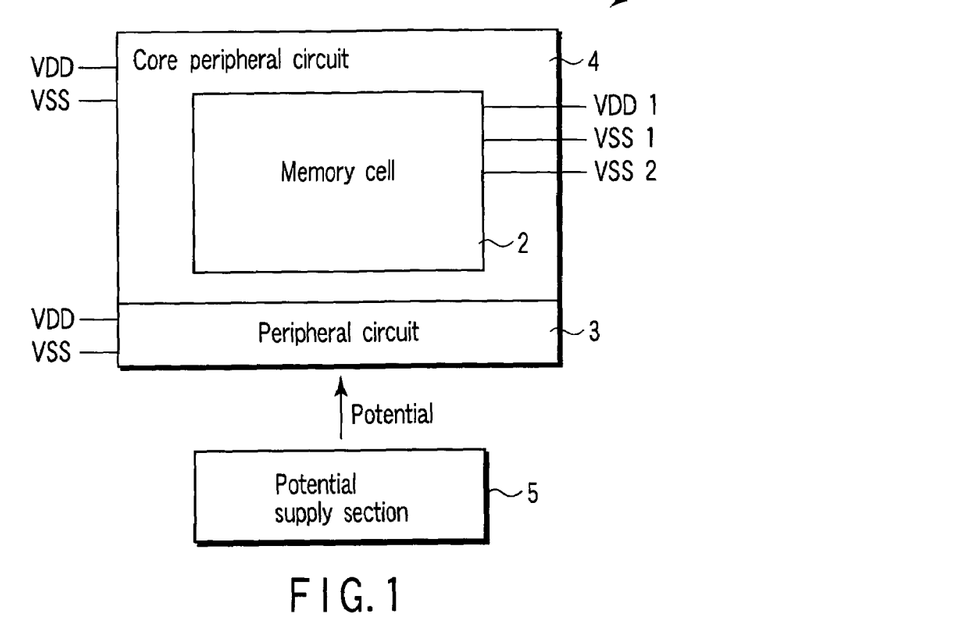
FIG. 1 is a diagram illustrating a main section of a static random access memory according to a first embodiment of the present invention.

FIG. 1 is a diagram illustrating a main section of a static random access memory 1 according to a first embodiment of the present invention. As shown in FIG. 1, the static random access memory 1 includes a memory cell array 2, a peripheral circuit 3, and a core periphery circuit 4. The memory cell array 2 has a constitution such that a plurality of memory cells, mentioned later, are provided. The peripheral circuit 3 has a data input/output circuit that gives and receives data to/from an outside, a command/address input circuit that supplies a command and an address to a memory, and a control circuit such as a decoder circuit. The core peripheral circuit 4 has a row decoder, a column decoder, a sense amplifier, and the like.

The memory cell array 2, the peripheral circuit 3, and the core peripheral circuit 4 are provided with an independent potential supply end. That is to say, the memory cell array 2 is provided with a potential supply end VDD1 for applying a power-source potential (high potential), potential supply ends VSS1 and VSS2 for applying a common potential (low potential, typically a ground potential). These potential supply ends are electrically connected to predetermined nodes of the memory cells, mentioned later, respectively. Similarly, the peripheral circuit 3 and the core peripheral circuit 4 have a potential supply end VDD for applying a power-source potential, and a potential supply end VSS for applying a common potential. These potential supply ends are electrically connected to an external potential supply section 5 of the static random access memory 1, and potentials are applied to respective sections via them.

Figure 2:
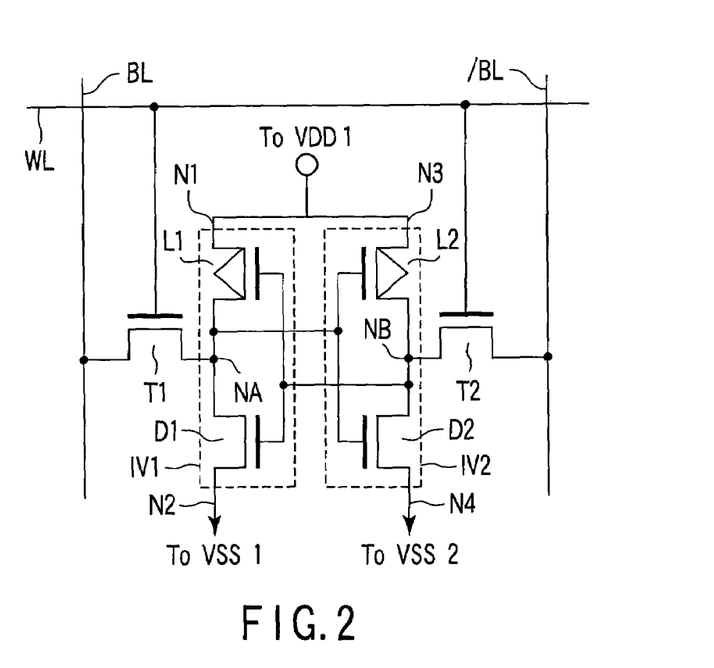
FIG. 2 is a diagram illustrating a memory cell according to the first embodiment.

FIG. 2 is a diagram illustrating the memory cell according to the first embodiment. As shown in FIG. 2, the memory cell has an inverter (first inverter) IV1 and an inverter IV2 (second inverter), a transfer transistor (first transfer transistor) T1, and a transfer transistor (second transfer transistor) T2.

The inverter IV1 is composed of a load element (first load element) L1 and a driving n-type MOS transistor (first driver transistor) D1 which are connected to each other in series. The drawing illustrates an example that a p-type MOS transistor (first load transistor) is used as the load element L1. In this case, a gate of the load transistor L1 is connected to a gate of the driver transistor D1. An end (first terminal) N1 of the load transistor L1 in the inverter IV1 is electrically connected to a power source line VDD1, and an end (second terminal) N2 of the driver transistor D1 is electrically connected to the potential supply end VSS1.

Similarly, the inverter IV2 is composed of a load element (second load element) L2 and a driving n-type MOS transistor (second driver transistor) D2 which are connected to each other in series. FIG. 2 illustrates a state that a p-type MOS transistor (second load transistor) is used as the load element L2, and a gate of the load transistor L2 is connected to a gate of the driver transistor D2. An end (third terminal) N3 of the load transistor L2 in the inverter IV2 is electrically connected to the power source line VDD1, and an end (fourth terminal) N4 of the driver transistor D2 is electrically connected to the potential supply end VSS2.

An input end of the inverter IV1 is connected to an output end of the inverter IV2, and an output end of the inverter IV1 is connected to an input end of the inverter IV2. The output end of the inverter IV1 is connected to a bit line BL via the transfer transistor T1, and the output end of the inverter IV2 is connected to a bit line /BL via the transfer transistor T2. Gates of the transfer transistors T1 and T2 are connected to a word line WL.

The memory cell is designed so that the transfer transistors T1 and T2, the load transistors L1 and L2, and the driver transistors D1 and D2 have the same gate length (L), the same gate width (W), and the same threshold value (Vth), respectively. The word line WL is activated at the time of reading, and the bit line BL or the bit line /BL is driven low by a cell current, so that cell data are read into the bit line BL or /BL. The word line WL is activated at the time of writing, and the bit line BL or /BL is biased to a potential according to desired data polarity so that data are written into the memory cell.

Figure 3:
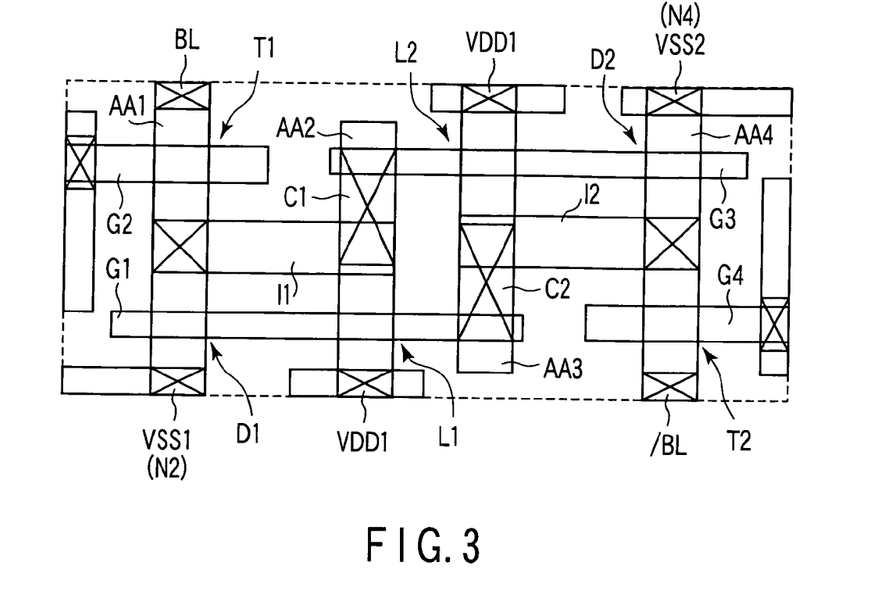
FIG. 3 is a plan view illustrating a main section of a point-symmetry type memory cell.

The potential supply ends VSS1 and VSS2 on the common potential side in the inverters IV1 and IV2 are separated from each other. This can be realized by adopting a so-called point-symmetry type memory cell. FIG. 3 is a plan view illustrating a main section of the point-symmetry type memory cell. As shown in FIG. 3, four active areas AA1 to AA4 are provided along the vertical axis of the figure.

A gate electrode G1 is provided over the active areas AA1, AA2 and AA3. The gate electrode G1 and diffusion layers on portions above and below the gate electrode G1 in the active area AA1 compose the driver transistor D1. The portion below the gate electrode G1 in the active area AA1 is electrically connected to the potential supply end VSS1.

The gate electrode G1 and diffusion layers on portions above and below the gate electrode G1 in the active area AA2 compose the load transistor L1. The portion below the gate electrode G1 in the active area AA2 is electrically connected to the potential supply end VDD1.

A gate electrode G2 is provided over an upper portion of the active area AA1. The gate electrode G2 and diffusion layers on portions above and below the gate electrode G2 in the active area AA1 compose the transfer transistor T1. The active areas AA1 and AA2 are connected to each other between the gate electrodes G1 and G2 by a wiring layer I1.

A gate electrode G3 is provided over upper portions of the active areas AA2, AA3, and AA4. The gate electrode G3 and diffusion layers on portions above and below the gate electrode G3 in the active area AA4 compose the driver transistor D2. The portion above the gate electrode G3 in the active area AA4 is electrically connected to the potential supply end VSS2.

The gate electrode G3 and diffusions layer on the portions above and below the gate electrode G3 in the active area AA3 compose the load transistor L2. The portion above the gate electrode G3 in the active area AA3 is electrically connected to the potential supply end VDD1.

A gate electrode G4 is provided over a lower portion of the active area AA4. The gate electrode G4 and diffusion layers on the portions above and below the gate electrode G4 in the active area AA4 compose the transfer transistor T2. The active areas AA3 and AA4 are connected to each other between the gate electrodes G3 and G4 by a wiring layer I2.

The wiring layer I1, the active area AA2, and the gate electrode G3 are connected by a contact C1. The wiring layer I2, the active area AA3, and the gate electrode G1 are connected by a contact C2.

In the point-symmetry type memory cell, since places corresponding to the nodes N2 and N4 in FIG. 2 are separated from each other, different potentials can be applied to the nodes N2 and N4, respectively.

Figure 4:
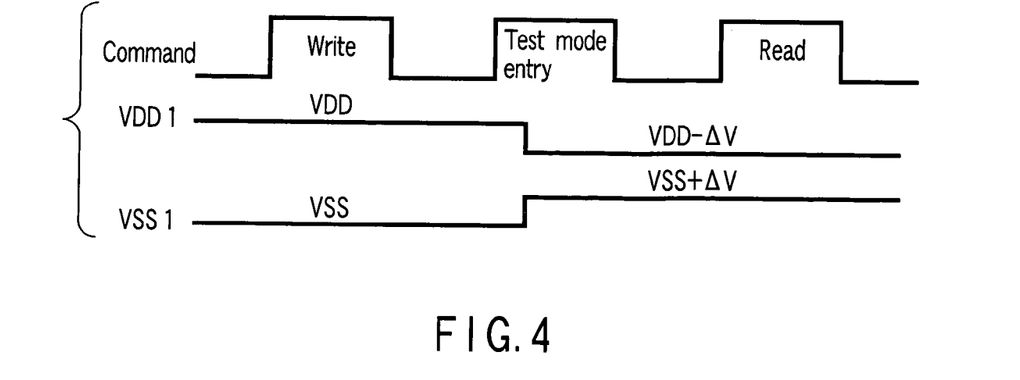
FIG. 4 is a diagram exemplifying an input command in an SNM measuring method according to the first embodiment.
Figure 5:
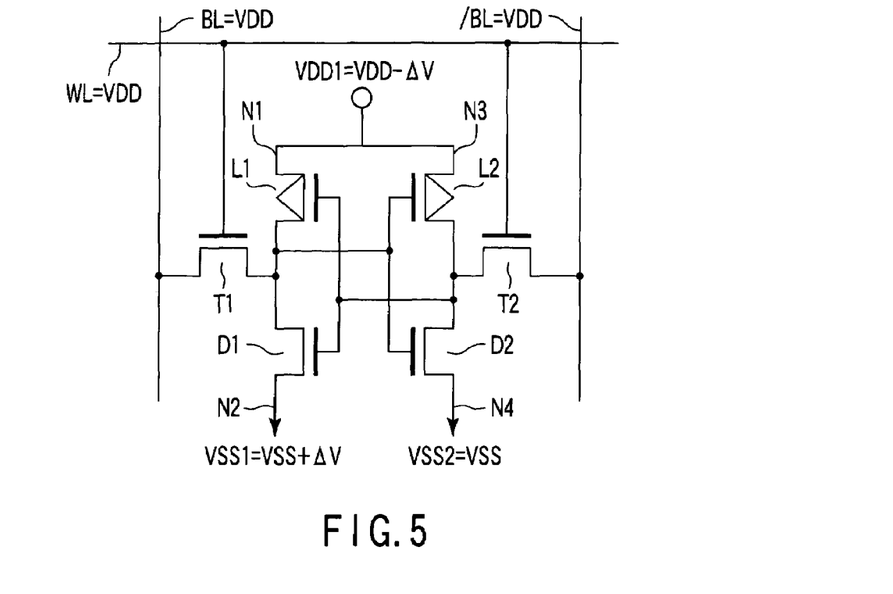
FIG. 5 is a diagram illustrating a state of a potential in the main section in the SNM measuring method according to the first embodiment.
Figure 9:
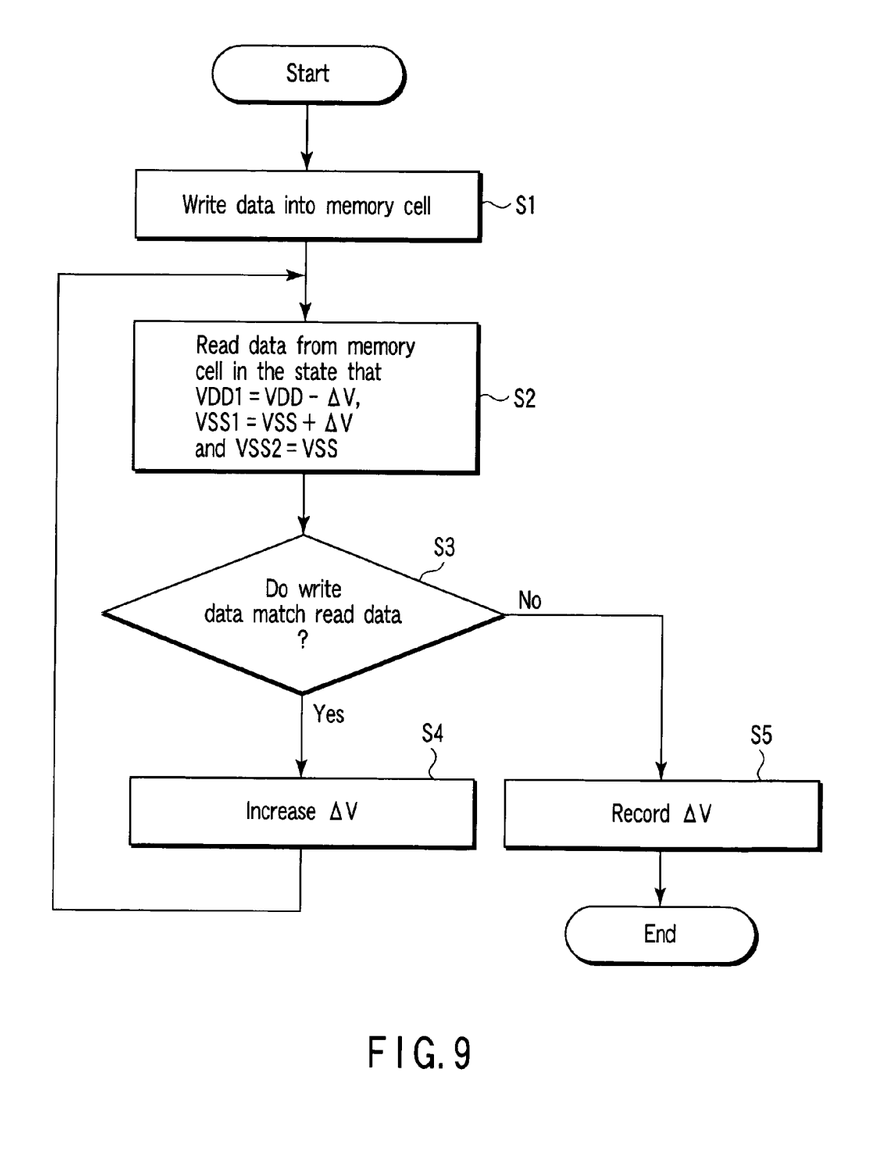
FIG. 9 is a flowchart illustrating the SNM measuring method according to the first embodiment.

With reference to FIGS. 4, 5 and 9, a pseudo-SNM measuring method at the time of holding "0" data is explained below. FIG. 9 is a flowchart illustrating a method of measuring a pseudo-static noise margin according to the first embodiment. As shown in FIGS. 4 and 9, a write command is supplied in a normal state, a potential VDD is applied to the potential supply end VDD1, and a potential VSS is applied to the potential supply ends VSS1 and VSS2. In this state, the "0" data are written into the memory cell (step S1). After a test mode command is input, as shown in FIG. 5, a potential VDD−$\Delta V$ is applied to the potential supply end VDD1, a potential VSS+$\Delta V$ is applied to the potential supply end VSS1, and a potential VSS is applied to the potential supply end VSS2. The potential VDD is always applied to the word line WL and the bit lines BL and /BL.

While $\Delta V$ is sequentially being increased, the data are read. That is to say, the data are read in a state that $\Delta V$=V0, and after that the data are read in a state that $\Delta V$=V1 (>V0). This process is repeated. $\Delta V$ at the time when the data read from the memory cell do not match the data written previously is recorded. That is to say, a potential VDD−$\Delta V$ is applied to the potential supply end VDD1, a potential VSS+$\Delta V$ is applied to the potential supply end VSS1, and a potential VSS is applied to the potential supply end VSS2. In this state, the data are read from memory cell (step S2). A determination is made whether write data match read data (step S3). When Yes is determined in step S3, $\Delta V$ is increased so as to be slightly larger than the previous $\Delta V$ (step S4), and the sequence goes to step S2. When the write data do not match the read data during the repetition of the process in steps S2 to S4, $\Delta V$ at that time is recorded (step S5), and the process is ended. The unmatched data read from the memory cell with the data previously written means that the data held by the memory cell are broken because the potential applied to the memory cell obtains a value after $\Delta V$ is added, and $\Delta V$ is regarded as pseudo-SNM. A series of the operation is performed simultaneously on all the memory cells, so that the pseudo-SNMs of all the memory cells holding "0" data can be obtained.

Also in the case where the memory cells hold "1" data, the same operation is performed. In this case, the potential supply end VSS1 is fixed so as to have the potential VSS, and a potential VSS+$\Delta V$ is applied to the potential supply end VSS2. The potential of the potential supply end VDD1 is VDD−$\Delta V$ similarly to the case of the "0" data. Similarly to the "0" data, the pseudo-SNMs of all the memory cells holding the "1" data can be obtained. As a result, a fail bitmap of the memory cells can be obtained.

Figure 6:
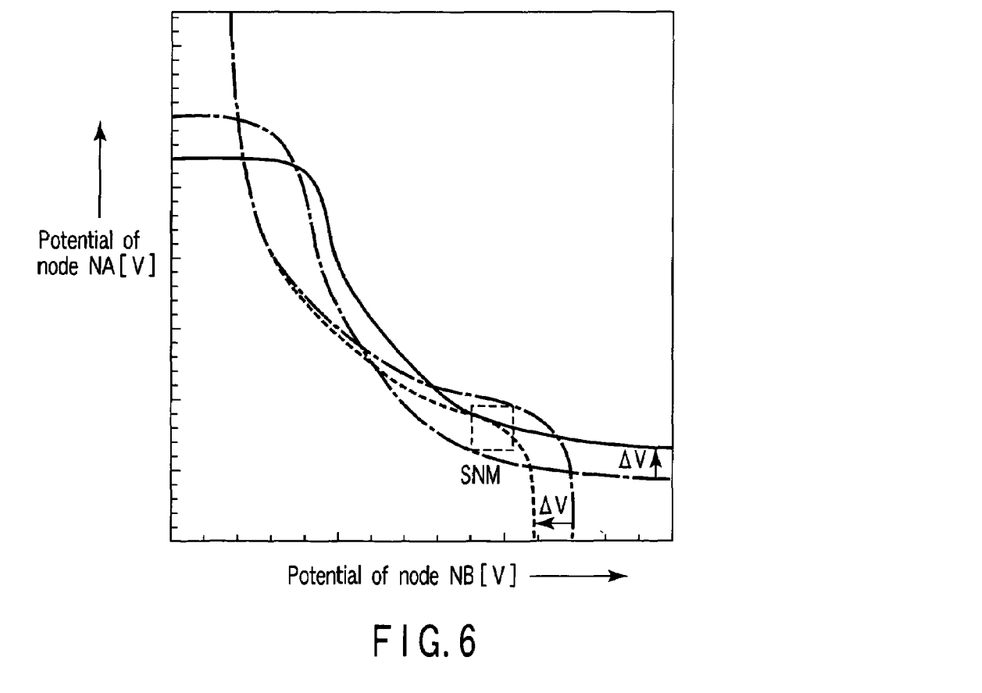
FIG. 6 is a diagram illustrating stability characteristics of the memory cell that holds "0" data when a potential to which ΔV is added is supplied.

FIG. 6 illustrates the stability characteristics of the memory cell holding the "0" data at the time when the potential to which $\Delta V$ is added is applied. In FIG. 6, a solid line represents the stability characteristics of the inverter IV1 in a state that the potential VDD−$\Delta V$ is applied to the potential supply end VDD1, the potential VSS+$\Delta V$ is applied to the potential supply end VSS1, and the potential VSS is applied to the potential supply end VSS2. A broken line represents the stability characteristics of the inverter IV2 in a state that the potential VDD−$\Delta V$ is applied to the potential supply end VDD1, the potential VSS is applied to the potential supply end VSS1, and the potential VSS+$\Delta V$ is applied to the potential supply end VSS2. In FIG. 6, as a reference, the stability characteristics of a memory cell obtained by the conventional method are represented by an alternate long and short dash line.

As shown in FIG. 6, stability characteristics curves (solid line and broken line) of the memory cells to which the potential with $\Delta V$ is applied are shifted from a stability curve (alternate long and short dash line) in the state that the normal potential is applied by $\Delta V$. A square representing SNM formed in an area surrounded by the alternate long and short dash line is not formed in the case of the solid line and the broken line. This means that the stability of the memory cells is degraded in the state that the potential with $\Delta V$ is applied.

According to the static random access memory of the first embodiment of the present invention, the data are sequentially read from the memory cells to which the potential obtained by adding $\Delta V$ to the normal potential is applied while $\Delta V$ is being sequentially changed. $\Delta V$ at the time when correct data are not read is regarded as SNM. For this reason, the pseudo-SNM can be measured without manufacturing a measurement memory cell separately from the memory cells as products. Further, SNMs of the memory cells as the products can be actually measured.

SNMs of many memory cells can be measured for a short time. For this reason, mass data about SNMs of the memory cells as the products can be obtained. As a result, weak cells can be screened before shipment, so that the reliability of the chips is improved.

(Second Embodiment)

Figure 7:
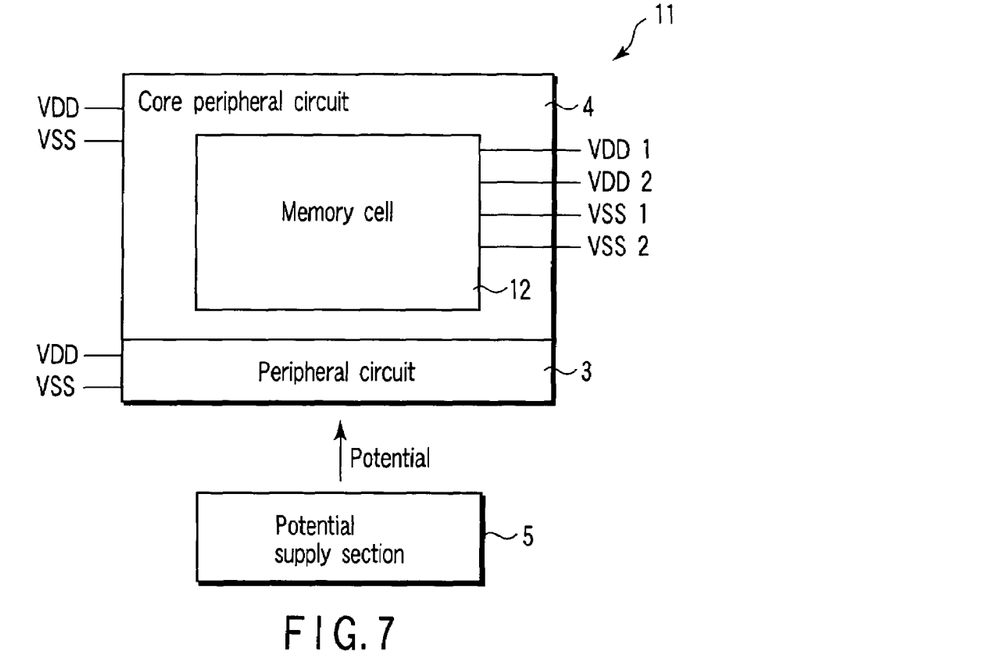
FIG. 7 is a diagram illustrating a main section of the static random access memory according to a second embodiment of the present invention.
Figure 8:
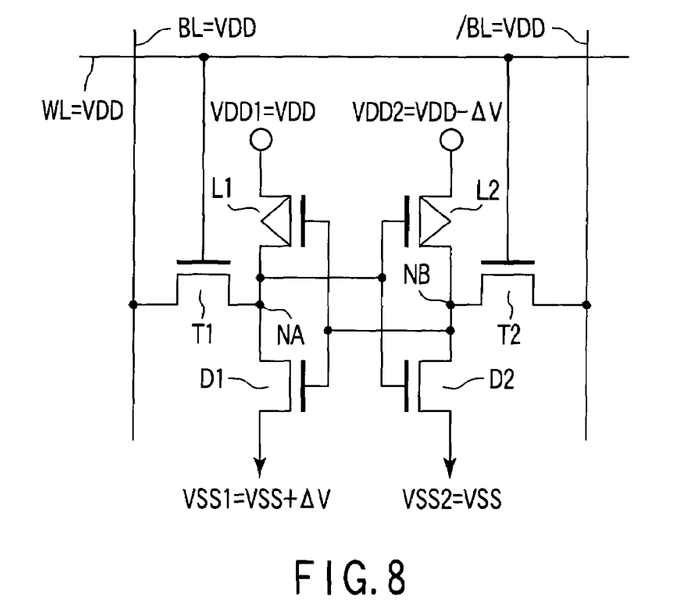
FIG. 8 is a diagram illustrating a state of a potential of the main section in the SNM measuring method according to the second embodiment.

In the first embodiment, SNM is measured in a state that a uniform potential is applied to the nodes N1 and N3 for applying a high potential to the inverters IV1 and IV2. In contrast, in the second embodiment, different potentials are applied to the nodes N1 and N3, respectively. FIG. 7 is a diagram illustrating a main section of the static random access memory 11 according to a second embodiment of the present invention. FIG. 8 illustrates a state that the memory cell according to the second embodiment, and a state of the potential of the main section in the SNM measuring method according to the second embodiment. As shown in FIGS. 7 and 8, the memory cell 12 has a potential supply end VDD2 for applying a power-source potential in addition to the constitution in FIG. 1. The potential supply end VDD1 is electrically connected to the inverter IV1, and the potential supply end VDD2 is electrically connected to the inverter IV2.

Figure 10:
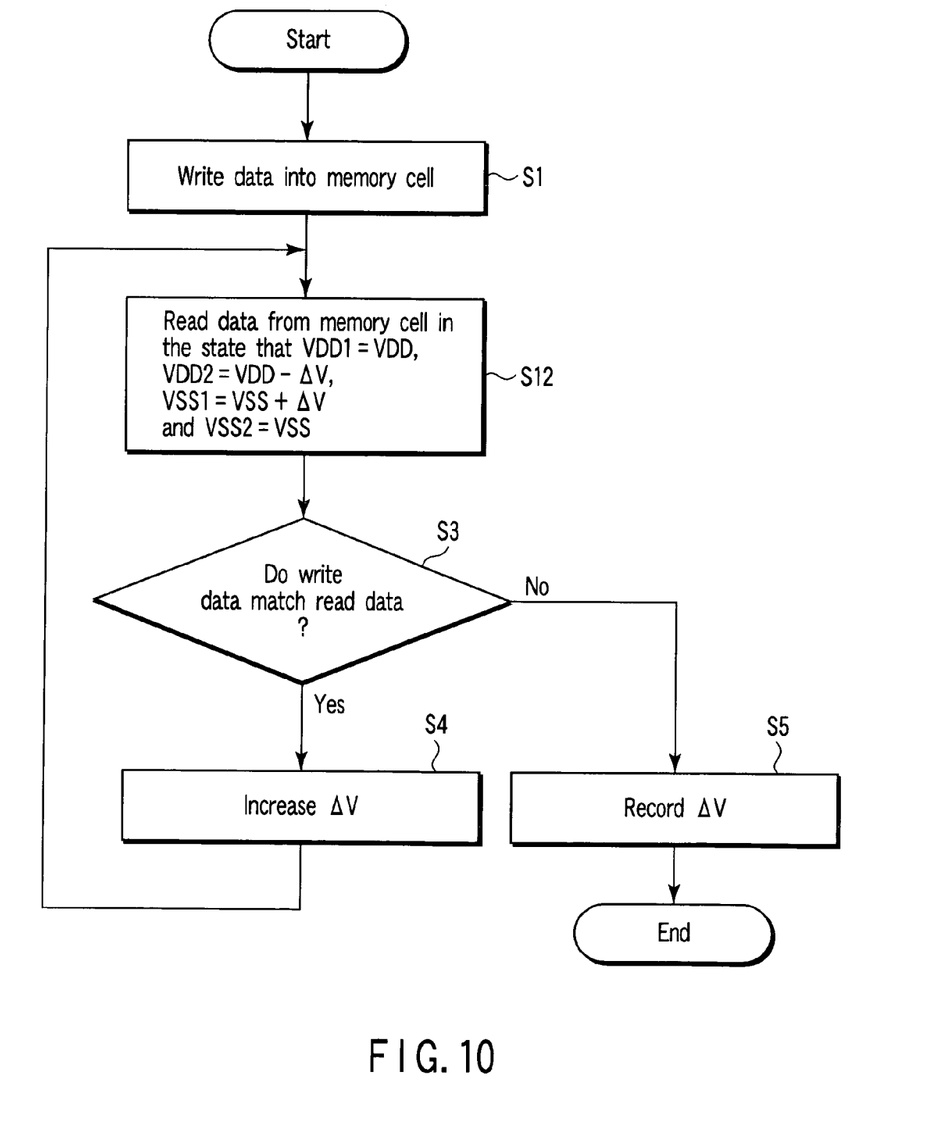
FIG. 10 is a flowchart illustrating the SNM measuring method according to the second embodiment.

The SNM measuring method is similar to that in the first embodiment, and the potentials to be applied to the memory cells are different. That is to say, as shown in FIG. 8, when the "0" data are read, the potential VDD is applied to the potential supply end VDD1, and the potential VDD−ΔV is applied to the potential supply end VDD2. Similarly to the first embodiment, the potential VSS+ΔV is applied to the potential supply end VSS1, and the potential VSS is applied to the potential supply end VSS2. Similarly to the first embodiment, while ΔV is being sequentially increased, the data are sequentially read, and ΔV at the time when correct data are not read is measured. A flowchart in FIG. 10 is similar to that in the first embodiment (FIG. 9), only a different part is that step S12 is executed instead of step S2. In step S12, the potential VDD is applied to the potential supply end VDD1, the potential VDD−ΔV is applied to the potential supply end VDD2, the potential VSS+ΔV is applied to the potential supply end VSS1, and the potential VSS is applied to the potential supply end VSS2. In this state, the data are read from the memory cell.

When the "1" data are read, the potential VDD−ΔV is applied to the potential supply end VDD1, the potential VDD is applied to the potential supply end VDD2, the potential VSS is applied to the potential supply end VSS1, and potential VSS+ΔV is applied to the potential supply end VSS2.

According to the static random access memory of the second embodiment of the present invention, similarly to the first embodiment, the data are read from the memory cells to which the potential obtained by adding ΔV to the normal potential is applied while ΔV is sequentially changed. ΔV at the time when correct data are not read is regarded as SNM. For this reason, the same effects as the first embodiment can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A static random access memory comprising a memory cell which comprises:

a first inverter having a first load element and a first transistor, a first input terminal and a first output terminal, the first load element and the first transistor being connected between a first terminal and a second terminal in series, a first potential being applied to the second terminal at a time when data are read from the memory cell;

a second inverter having a second load element and a second transistor, a second input terminal connected to the first output terminal and a second output terminal connected to the first input terminal, the second load element and the second transistor being connected between a third terminal and a fourth terminal in series, a second potential different from the first potential being applied to the fourth terminal at a time when data are read from the memory cell;

a first transfer transistor which selectively and electrically connects the first output terminal and a first bit line; and a second transfer transistor which selectively and electrically connects the second output terminal and a second bit line.

2. The memory according to claim 1, wherein, when the data are read from the memory cell, a third potential is applied to the first terminal and the third terminal.

3. The memory according to claim 1, wherein, when first data are read from the memory cell, a high potential−ΔV is applied to the first terminal and the third terminal, a low potential lower than the high potential is applied to the fourth terminal, and the low potential+ΔV is applied to the second terminal.

4. The memory according to claim 3, wherein, when second data are read from the memory cell, the high potential−ΔV is applied to the first terminal and the third terminal, the low potential is applied to the second terminal, and the low potential+ΔV is applied to the fourth terminal.

5. The memory according to claim 1, wherein, when the data are read from the memory cell, a third potential is applied to the first terminal, and a fourth potential different from the third potential is applied to the third terminal.

6. The memory according to claim 1, wherein, when first data are read from the memory cell, a high potential is applied to the first terminal, the high potential−ΔV is applied to the third terminal, a low potential lower than the high potential is applied to the fourth terminal, and the low potential+ΔV is applied to the second terminal.

7. The memory according to claim 6, wherein, when second data are read from the memory cell, the high potential−ΔV is applied to the first terminal, the high potential is applied to the third terminal, the low potential is applied to the second terminal, and the low potential+ΔV is applied to the fourth terminal.

8. A pseudo-static noise margin measuring method for a memory cell which comprises:

a first inverter having a first load element and a first transistor, a first input terminal and a first output terminal, the first load element and the first transistor being connected between a first terminal and a second terminal in series;

a second inverter having a second load element and a second transistor, a second input terminal connected to the first output terminal and a second output terminal connected to the first input terminal, the second load element and the second transistor being connected between a third terminal and a fourth terminal in series;

a first transfer transistor which selectively and electrically connects the first output terminal and a first bit line; and a second transfer transistor which selectively and electrically connects the second output terminal and a second bit line, the method comprising:

in a state that a high potential is applied to the first terminal and the third terminal and a low potential lower than the high potential is applied to the second terminal and the fourth terminal, writing write data into the memory cell;

after the write data are written into the memory cell, in a state that the high potential$-\Delta V$ is applied to the first terminal and the third terminal, the low potential is applied to the fourth terminal and the low potential$+\Delta V$ is applied to the second terminal, reading read data from the memory cell; and verifying matching of the write data with the read data.

9. The method according to claim 8, wherein, after the matching of the write data with the read data is verified, the reading of the read data and the verification of the matching between the write data and the read data are repeated until the read data do not match the write data in a state that $\Delta V$ is increased so as to be larger than $\Delta V$ at the time when the read data are read from the memory cell at the previous time.

10. A pseudo-static noise margin measuring method for a memory cell which comprises:

a first inverter having a first load element and a first transistor, a first input terminal and a first output terminal, the first load element and the first transistor being connected between a first terminal and a second terminal in series;

a second inverter having a second load element and a second transistor, a second input terminal connected to the first output terminal and a second output terminal connected to the first input terminal, the second load element and the second transistor being connected between a third terminal and a fourth terminal in series;

a first transfer transistor which selectively and electrically connects the first output terminal and a first bit line; and a second transfer transistor which selectively and electrically connects the second output terminal and a second bit line, the method comprising:

in a state that a high potential is applied to the first terminal and the third terminal and a low potential lower than the high potential is applied to the second terminal and the fourth terminal, writing write data into the memory cell;

after the write data are written into the memory cell, in a state that the high potential is applied to the first terminal, the high potential$-\Delta V$ is applied to the third terminal, the low potential is applied to the fourth terminal and the low potential$+\Delta V$ is applied to the second terminal, reading read data from the memory cell; and verifying matching of the write data with the read data.

11. The method according to claim 10, wherein, after the matching of the write data with the read data is verified, the reading of the read data and the verification of the matching between the write data and the read data are repeated until the read data do not match the write data in a state that $\Delta V$ is increased so as to be larger than $\Delta V$ at the time when the read data are read from the memory cell at the previous time.

* * * * *